(12) United States Patent
Hou et al.

(10) Patent No.: US 12,512,801 B2
(45) Date of Patent: Dec. 30, 2025

(54) SQUELCH DETECTOR

(71) Applicant: GIGADEVICE SEMICONDUCTOR INC., Beijing (CN)

(72) Inventors: Dequan Hou, Beijing (CN); Sanlin Liu, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 266 days.

(21) Appl. No.: 18/522,544

(22) Filed: Nov. 29, 2023

(65) Prior Publication Data

US 2024/0305258 A1 Sep. 12, 2024

(30) Foreign Application Priority Data

Mar. 7, 2023 (CN) .......................... 202310220013.9

(51) Int. Cl.

| | |
|---|---|
| G01R 19/165 | (2006.01) |
| H03G 1/00 | (2006.01) |
| H03G 3/00 | (2006.01) |
| H03G 3/34 | (2006.01) |
| H03K 5/1532 | (2006.01) |
| H03K 5/24 | (2006.01) |

(52) U.S. Cl.
CPC ........... *H03G 3/342* (2013.01); *H03G 1/0035* (2013.01); *H03G 3/007* (2013.01)

(58) Field of Classification Search
None
See application file for complete search history.

(56) References Cited

U.S. PATENT DOCUMENTS

| | | | | |
|---|---|---|---|---|
| 7,038,499 B1 * | 5/2006 | Toosky | ..................... | H03K 5/13 327/78 |
| 7,120,408 B2 * | 10/2006 | Wood | ..................... | H04L 25/085 455/220 |
| 7,274,221 B2 * | 9/2007 | Kim | ....................... | H03K 5/249 327/78 |
| 7,471,118 B2 * | 12/2008 | Liu | .......................... | H03G 3/34 327/81 |
| 7,586,336 B2 * | 9/2009 | Blum | ..................... | H03G 3/345 327/63 |
| 7,653,367 B2 * | 1/2010 | Song | ....................... | H03G 3/341 455/283 |
| 7,825,697 B2 * | 11/2010 | Hsiung | ................. | H03K 5/1252 327/34 |
| 8,179,148 B2 * | 5/2012 | Fukuda | ............... | G06F 13/4072 702/193 |
| 8,497,711 B2 * | 7/2013 | Hsieh | ................... | H04L 25/0292 327/72 |

(Continued)

*Primary Examiner* — Tuan A Tran
(74) *Attorney, Agent, or Firm* — Ziegler IP Law Group, LLC.

(57) ABSTRACT

A squelch detector is disclosed by the present application. By configuring the first to third bias current sources and a mirror ratio of the current mirror circuit, when an amplitude difference between first and second input signals is smaller or greater than a squelch threshold, flip of an output node in the squelch detector depends only on the squelch threshold and is independent of variations of process, voltage and temperature (PVT) parameters. Thus, the squelch detector can always provide reliable amplitude detection of input signals despite of possible variations of the PVT parameters.

18 Claims, 9 Drawing Sheets

(56) References Cited

U.S. PATENT DOCUMENTS

| | | | |
|---|---|---|---|
| 8,538,362 B2* | 9/2013 | Srivastava | H04B 1/1027 455/222 |
| 8,824,987 B2* | 9/2014 | Zhan | H03G 3/344 455/283 |
| 8,843,093 B2* | 9/2014 | De Vita | H03K 5/2481 455/222 |
| 9,319,041 B1* | 4/2016 | Wang | H03K 5/2481 |
| 9,360,505 B1* | 6/2016 | Wang | G01R 19/165 |
| 9,407,229 B2* | 8/2016 | Aw | H03G 3/341 |
| 10,120,436 B2* | 11/2018 | Low | G06F 13/4282 |
| 10,734,984 B2* | 8/2020 | Zhang | H03K 5/2481 |
| 10,910,998 B2* | 2/2021 | Delshadpour | H03G 3/341 |
| 11,233,488 B2* | 1/2022 | Singh | H03F 3/45179 |
| 11,378,600 B2* | 7/2022 | Delshadpour | G06F 13/4045 |
| 11,747,372 B2* | 9/2023 | Liu | G01R 31/66 324/538 |
| 12,348,201 B2* | 7/2025 | Singh | H03F 3/45179 |
| 2005/0026581 A1* | 2/2005 | Wood | H04L 25/085 455/219 |
| 2008/0278227 A1 | 11/2008 | Liu | |
| 2017/0277249 A1* | 9/2017 | Low | G06F 13/4282 |
| 2020/0091868 A1* | 3/2020 | Delshadpour | H03K 5/249 |
| 2022/0018881 A1* | 1/2022 | Delshadpour | G06F 13/4282 |

* cited by examiner

SQUELCH DETECTOR

CROSS-REFERENCE TO RELATED APPLICATION

This application claims the priority of Chinese patent application number 202310220013.9, filed on Mar. 7, 2023, and entitled "SQUELCH DETECTOR", the entire contents of which are incorporated herein by reference.

TECHNICAL FIELD

The present invention relates to the field of signal transmission technology and, in particular, to a squelch detector.

BACKGROUND

The USB, PCIe and MIPI protocols have been widely used in electronic devices, bringing convenience to our lives. These protocols use differential signals to transmit data and specify the amplitude of such differential signals. A circuit for detecting an amplitude difference of differential signals is called a squelch detector, and a threshold voltage of the circuit is called a squelch threshold.

FIGS. 1a and 1b respectively shows a system block diagram and a signal timing diagram of a squelch detector, in which VRP and VRN represent reference voltages of the squelch detector, and a squelch threshold VSQ is defined as VSQ=VRP−VRN. Moreover, VIP and VIN represent input differential signals, and VO is an output signal. When VO=0, it is indicated that the input differential signals VIP and VIN are valid. On the contrary, when VO=1, it is indicated that the input differential signals VIP and VIN are invalid. Referring to FIG. 1b, if an amplitude difference of the differential signals VIP and VIN, |VIP−VIN|, is smaller than the squelch threshold VSQ, i.e., |VIP−VIN|<VSQ, it is indicated that the differential signals VIP and VIN are between the first reference voltage VRP and the second reference voltage VRN, which means, they are "squelched" and invalid, leading to the output of VO=1.

Existing squelch detectors tend to have a squelch threshold VSQ easily varying with parameters such as process, voltage and temperature (PVT) beyond a range specified by a protocol, making them incapable of reliable amplitude detection of differential signals. This is undesirable for on-chip implementation of the protocol.

Therefore, there is a need for a squelch detector capable of reliable amplitude detection of input signals in spite of possible variation of PVT parameters.

SUMMARY OF THE INVENTION

The present invention provides a squelch detector comprising an amplitude comparator circuit, wherein the amplitude comparator circuit comprises:
  a squelch threshold setting circuit coupled to each of a first bias current source, a first reference voltage and a second reference voltage, wherein the squelch threshold setting circuit is configured to set a squelch threshold of the squelch detector to be equal to a difference between the first reference voltage and the second reference voltage, and to generate a current associated with the first bias current source and the squelch threshold;
  a signal input circuit coupled to each of a second bias current source, a first input signal and a second input signal, wherein the signal input circuit is configured to generate, based on the second bias current source, a current associated with an amplitude difference between the first input signal and the second input signal; and
  a current mirror circuit coupled to each of a third bias current source, the squelch threshold setting circuit and the signal input circuit, wherein the current mirror circuit is configured to: generate a first mirror current of the current output from the squelch threshold setting circuit, generate a difference current between the current output from the signal input circuit and the first mirror current, and generate a second mirror current of the difference current; and provide the third bias current source and the second mirror current to a corresponding output node in the squelch detector to control a flip of the output node,
  wherein when the second mirror current is greater or smaller than the third bias current source, the output node is flipped.

BRIEF DESCRIPTION OF THE DRAWINGS

Those of ordinary skill in the art will appreciate that the following drawings are presented merely to enable a better understanding of the present invention rather than to limit the scope thereof. In the drawings:

FIG. 1b is a signal timing diagram of the conventional squelch detector of FIG. 1a;

FIG. 2 is a schematic diagram showing a particular circuit implementation of the conventional squelch detector of FIG. 1a;

FIG. 4 is a signal timing diagram of the squelch detector of FIG. 3a;

DETAILED DESCRIPTION

Figure 1A:
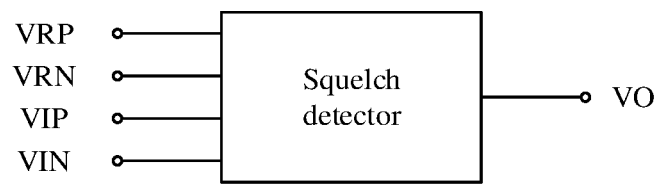
FIG. 1a is a system block diagram of a conventional squelch detector.
Figure 1B:
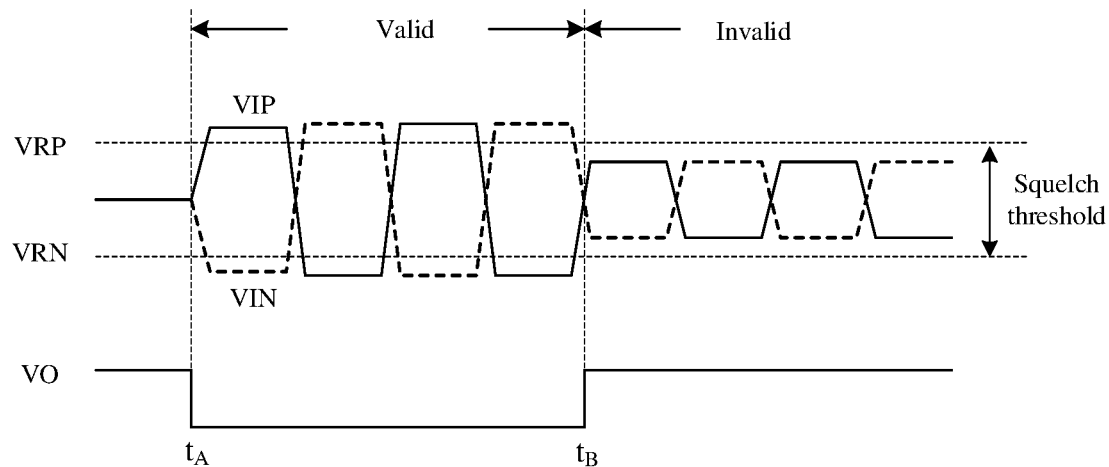

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessarily obscuring of the invention. It is understood that the invention may be embodied in many different forms and should not be construed as being limited to the embodiments set forth below. Rather, these embodiments are provided so that this disclosure illustrates the scope of the invention to those skilled in the art. In the drawings, the same reference numerals refer to the same elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

Figure 2:
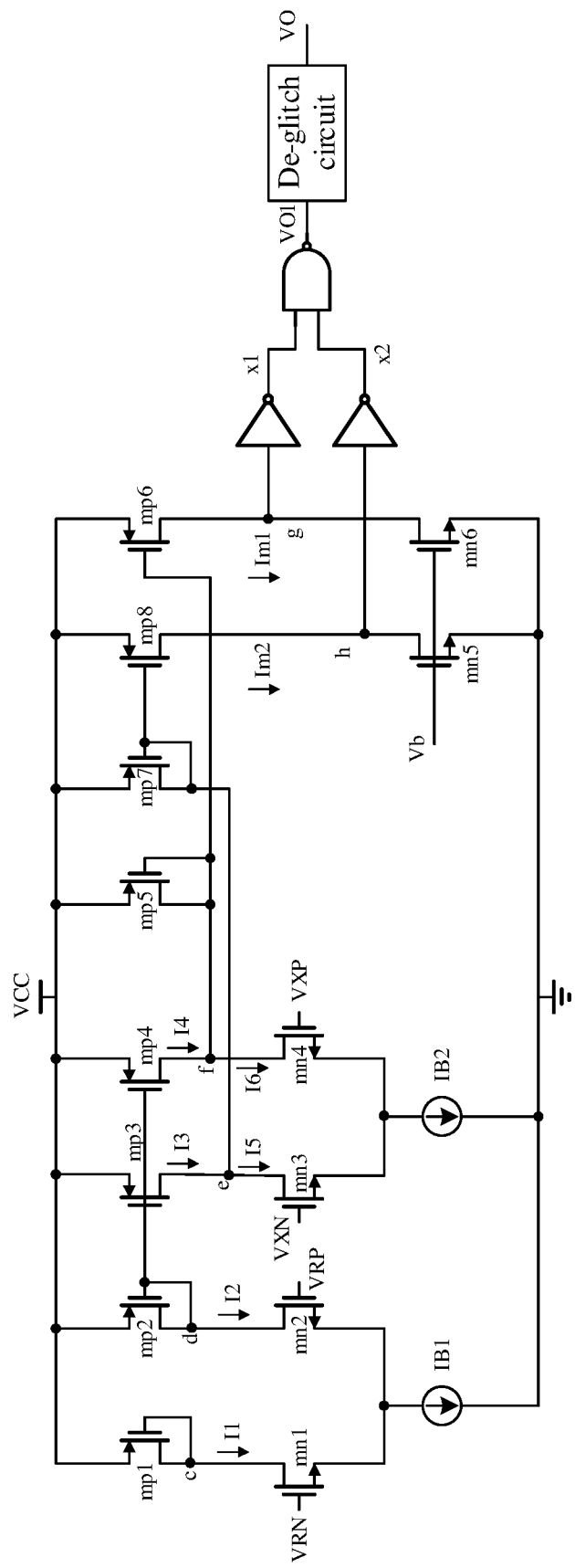

FIG. 2 is a schematic circuit diagram of a squelch detector according to a suboptimal embodiment. The squelch detector includes transistors mp1-mp8, transistors mn1-mn6, inverters x1-x2, a NAND gate and a deglitch circuit. VRP and VRN represent reference voltages of the squelch detector, which define a squelch threshold VSQ of the squelch detector as VSQ=VRP−VRN. VXP and VXN are a pair of input differential signals. Both the transistors mp3 and mp4 mirror a current flowing through the transistor mp2. The transistor mp6 mirrors a current flowing through the transistor mp5, and the transistor mp8 mirrors a current flowing through the transistor mp7. Both the transistors mp6 and mp8 are sized N times as large as the transistors mp5 and mp7. The transistor mn5 acts as a load of the transistor mp8, and the transistor mn6 acts as a load of the transistor mp6.

When an amplitude difference between the differential signals VXP and VXN is smaller than VSQ, i.e., |VXP−VXN|<VSQ, a current I5 flowing through the transistor mn3 and a current I6 flowing through the transistor mn4 are smaller than a current I3 flowing through the transistor mp3 and a current I4 flowing through the transistor mp4. Drain currents of the transistors mp5 and mp7 are zero or almost zero, a current Im2 of the transistor mp8 mirrored from the transistor mp7 (i.e., a drain current of the transistor mp8) and a current Im1 of the transistor mp6 mirrored from the transistor mp5 (i.e., a drain current of mp6) are also zero or almost zero. As a result, nodes h and g are pulled down by the transistors mn5 and mn6 to a low level, and both VO1 and VO are also at a low level. Thus, the differential signals VXP and VXN are squelched and invalid.

When VXP−VXN>VSQ, I6>I4 and I5<I3. As a result, there are currents flowing through the transistors mp5 and mp6, and the current Im1=N*(I6−I4). A voltage at the node g is pulled up by the current Im1, and both VO1 and VO are at a high level. Thus, the input signals VXP and VXN are valid.

Likewise, when VXN−VXP>VSQ, I5>I3 and I6<I4. As a result, there are currents flowing through the transistors mp7 and mp8, and the current Im2=N*(I5−I3). A voltage at the node h is pulled up by the current Im2, and both VO1 and VO are at a high level. Thus, the input signals VXP and VXN are valid.

After passing through the deglitch circuit, VO1 is converted into the final output signal VO. Around crossings of the differential signals VXP and VXN, their amplitude difference is smaller than VSQ, leading to transient low-level glitches in VO1. The deglitch circuit functions to filter out these glitches, avoiding the squelch detector from incorrectly outputting low level signals around the crossings.

In the circuit of FIG. 2, since the differential signals VXP and VXN are transmitted at a data rate of from several hundreds of Mbps to several Gbps, in order to achieve accurate detection of the amplitude difference between VXP and VXN, parasitic capacitance at the nodes e, f, g and h must be minimized to enable the squelch detector to have a bandwidth encompassing the frequency of the input signals. When VXP and VXN are both DC signals, the squelch threshold VSQ is a theoretical value equal to (VRP−VRN).

In practice, variations of process, voltage and temperature (PVT) parameters may lead to a significant deviation of the squelch threshold VSQ of the circuit of FIG. 2 from the theoretical (VRP−VRN).

Specifically, denoting maximum and minimum values of a power supply voltage VCC in the circuit of FIG. 2 as VCCmax and VCCmin, respectively, when the circuit is fabricated at different process corners, such as SS_125C_VCCmin (a slow process corner featuring a slow process variation for both PMOS and NMOS transistors, a temperature of 125° C. and the minimum power supply voltage of VCCmin) and FF_M40_VCCmax (a fast process corner featuring a fast process variation for both PMOS and NMOS transistors, a temperature of −40° C. and the maximum power supply voltage of VCCmax), it will show big difference between the currents Im1 and Im2, as well as different pull-down capacities of the transistors mn5 and mn6, due to different threshold voltage, parasitic capacitance and other parameters of the MOS transistors mp2-mp8 and mn5-mn6. Consequently, VSQ of the circuit may greatly deviate from the theoretical value, and the deviation may exceed a tolerance limit specified by a protocol.

Therefore, it is very likely for the practical squelch threshold VSQ of the squelch detector of FIG. 2 to exceed a tolerance limit specified by a protocol due to variations of the PVT parameters, making the squelch detector incapable of reliable amplitude detection of differential signals. This is undesirable for on-chip implementation of the protocol.

In view of this, the present invention provides a squelch detector including a current mirror circuit with accurately designed mirror ratios, which allow inversion of an output node to be determined only by a theoretical squelch threshold value, thereby immunizing the squelch threshold from the influence of practical variations of the PVT parameters.

The present invention will be described in greater detail below with reference to the accompanying drawings and to specific embodiments. Advantages and features of the invention will become more apparent from the following description. Note that the figures are provided in a very simplified form not necessarily drawn to exact scale and for the only purpose of facilitating easy and clear description of the disclosed embodiments.

Embodiment 1

Figure 3A:
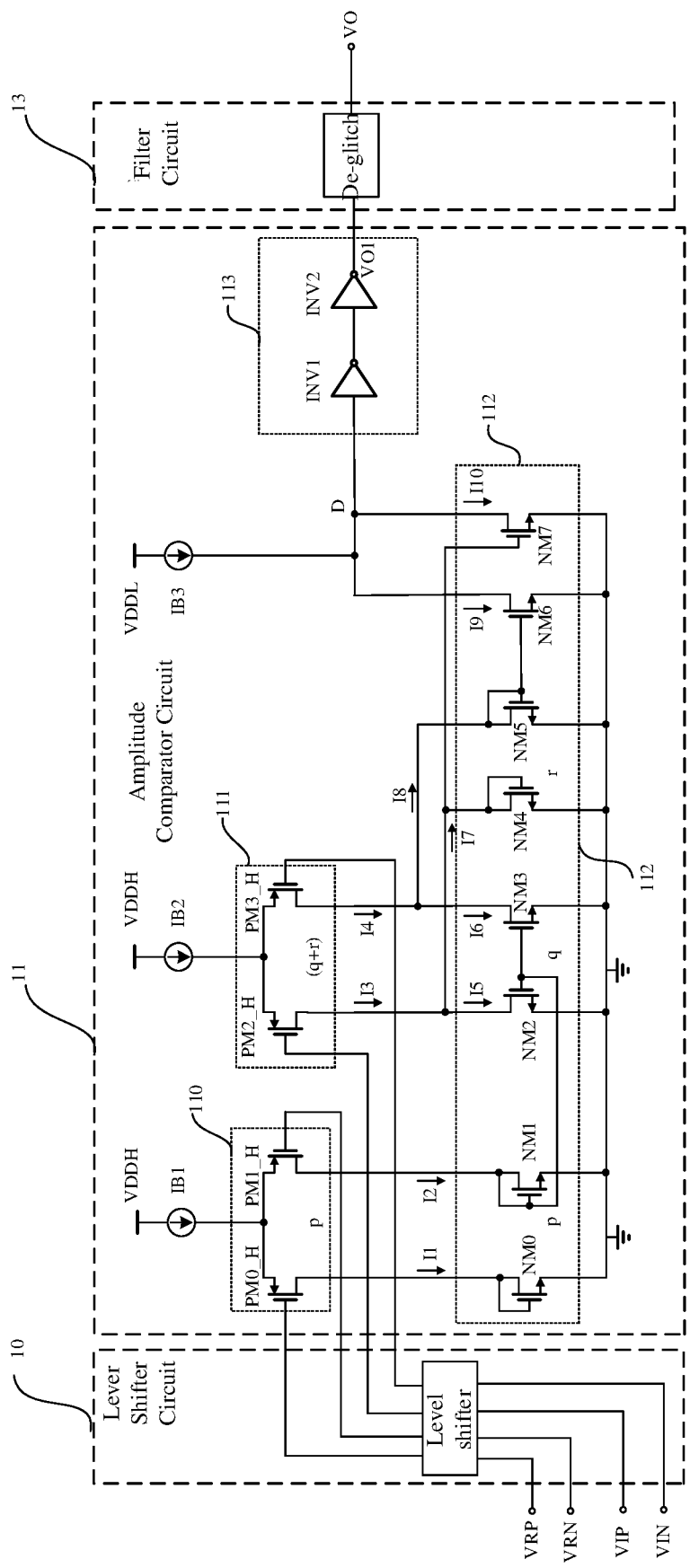
FIG. 3a is a schematic diagram showing a particular, exemplary circuit implementation of a squelch detector according to a first embodiment of the present invention.
Figure 3B:
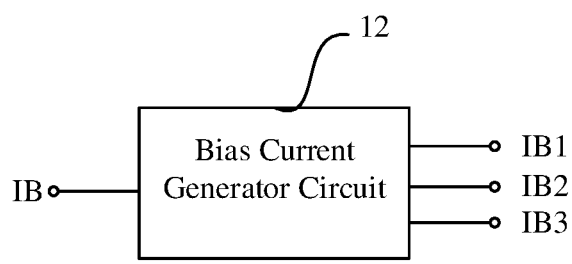
FIG. 3b is a system block diagram of a bias current generator circuit in the squelch detector according to the first embodiment of the present invention.

Referring to FIGS. 3a and 3b, a squelch detector according to an embodiment of the present invention includes a level shifter circuit 10, an amplitude comparator circuit 11, a bias current source generator circuit 12 and a filter circuit 13.

Figure 4:
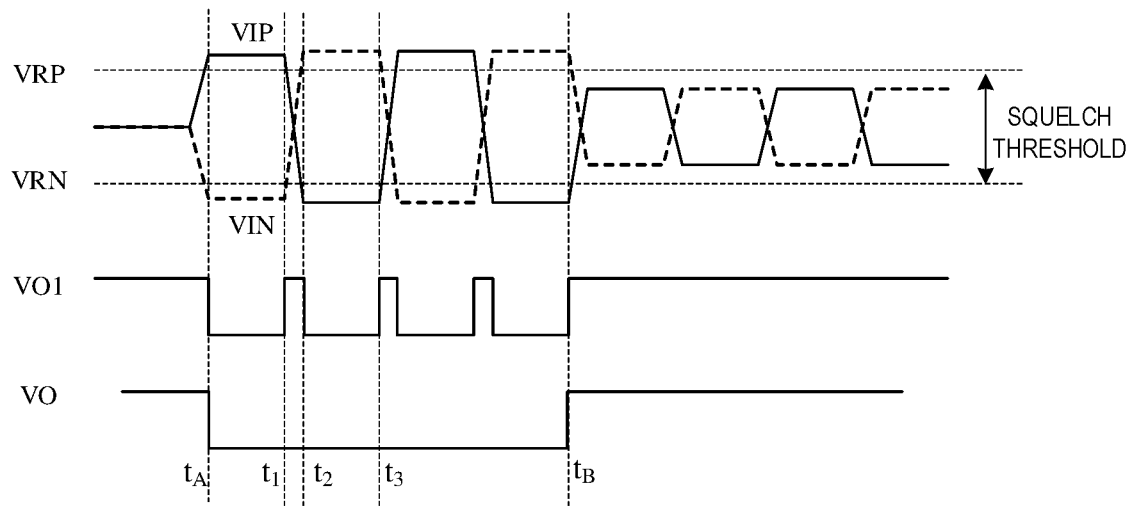

The level shifter circuit 10 is coupled to the amplitude comparator circuit 11 and configured to shift each of a first input signal VIP, a second input signal VIN, a first reference voltage VRP and a second reference voltage VRN to a suitable level and output it to an amplitude comparator circuit 11. The bias current source generator circuit 12 is coupled to a reference bias current IB and the amplitude comparator circuit 11 and configured to generate, based on the reference bias current IB, a first bias current source IB1, a second bias current source IB2 and a third bias current source IB3 and provide them to the amplitude comparator circuit 11. The filter circuit 13 serves to filter out glitches in an output signal VO1 of the amplitude comparator circuit 11, avoiding the squelch detector from generating a wrong output. As shown in FIG. 4, between t1 and t2, an amplitude difference of VIP and VIN is smaller than a squelch threshold VSQ, and there are high-level glitches in VO1. These high-level glitches are eliminated after passing through the filter circuit 13. The squelch threshold VSQ is a theoretical value equal to (VRP−VRN).

Each of the level shifter circuit 10, the bias current source generator circuit 12 and the filter circuit 13 may be implemented by any suitable circuit design known in the art, and this embodiment is not particularly limited in this regard. For example, the level shifter circuit 10 may be built with discrete components such as MOS transistors and resistors, or implemented as a source follower comprising a high-voltage MOS transistor, or as a dedicated level shifter chip. Other options are also possible. For example, the bias current source generator circuit 12 may be composed of a reference current source and a current mirror formed by a plurality of MOS transistors, or implemented as a dedicated bias current source generator chip. Other options are also possible. For example, the filter circuit 13 may be implemented as an RC filter circuit, an LC filter circuit, a dedicated filter chip or the like.

As a core component of the squelch detector, the amplitude comparator circuit 11 receives the first reference voltage VRP and the second reference voltage VRN from the level shifter circuit 10 and, based on the first reference voltage VRP and the second reference voltage VRN, sets the squelch threshold VSQ of the squelch detector as VSQ=VRP−VRN. VSQ is a theoretical value that totally depends on the magnitudes of the input VRP and VRN. Additionally, it calculates the amplitude difference |VIP−VIN| of the first input signal VIP and the second input signal VIN and determines whether the amplitude difference of the first input signal VIP and the second input signal VIN exceeds the squelch threshold VSQ. If the amplitude difference |VIP−VIN| of the first input signal VIP and the second input signal VIN is smaller than the squelch threshold VSQ, it is indicated that the first input signal VIP and the second input signal VIN lie between the first reference voltage VRP and the second reference voltage VRN and are thus in a squelched state. In response, the amplitude comparator circuit 11 outputs VO1=1. In some applications, VIP and VIN in this squelched state are considered invalid.

In this embodiment, the amplitude comparator circuit 11 includes a squelch threshold setting circuit 110, a signal input circuit 111, a current mirror circuit 112 and a logic circuit 113.

The squelch threshold setting circuit 110 is coupled to each of the first bias current source IB1, the first reference voltage VRP and the second reference voltage VRN, and is configured to set the squelch threshold of the squelch detector as VSQ=VRP−VRN. Moreover, it is configured to generate currents associated with the first bias current source IB1 and the squelch threshold VSQ=VRP−VRN, including a first current I1 and a second current I2, where I2=k*IB1, and k is a parameter related to the squelch threshold VSQ.

The signal input circuit 111 is coupled to the second bias current source IB2, the first input signal VIP and the second input signal VIN, and is configured to generate, based on the second bias current source IB2, currents associated with the amplitude difference |VIP−VIN| between the first input signal VIP and the second input signal VIN, including a third current I3 and a fourth current I4.

The current mirror circuit 112 is coupled to the third bias current source IB3, the squelch threshold setting circuit 110 and the signal input circuit 111 and is configured to generate a first mirror current I5 (referred to hereinafter as the "fifth current") and a first mirror current I6 ("sixth current") of the output current I2 of the squelch threshold setting circuit 11. Moreover, it is configured to generate a difference current I7 between the output current I3 of the signal input circuit 111 and the first mirror current I5, as well as a second mirror current I9 (first component of second mirror current) as a mirror current of I7. Alternatively, it is configured to generate a difference current I8 between the output current I4 of the signal input circuit 111 and the first mirror current I6, as well as a second mirror current I10 (second component of second mirror current) as a mirror current of the difference current I8. Further, it is configured to provide the third bias current source IB3 and the second mirror current (I9 or I10) at an associated output node D of the squelch detector for inversion control of the output node D. When I9 or I10 is greater or smaller than the third bias current source IB3, the output node D will be flipped.

The logic circuit 113 is coupled to the output node D, and is configured to output, based on whether the output node D is flipped, a corresponding logical signal VO1 indicating whether the amplitude difference between the first input signal VIP and the second input signal VIN exceeds the squelch threshold VSQ.

In further embodiments, a ratio of the third bias current source IB3 to the first bias current source IB1 is a first predetermined ratio configured in association with a mirror ratio of the current mirror circuit 112 and the squelch threshold VSQ.

In further embodiments, a ratio of the first bias current source IB1 to the second bias current source IB2 provided by the bias current source generator circuit 12 is a second predetermined ratio, which is a constant associated with only the mirror ratio of the current mirror circuit 112. As an example, the second predetermined ratio may be p/(q+r), and the first predetermined ratio may be k*s*r/p. I.e., IB1:IB2=p:(q+r), and IB3=(s*r/p)*k*IB1, where k is a parameter associated with the squelch threshold, and p, q, r and s are all mirror ratios of the current mirror circuit 112. In this way, the output node D will be pulled down (i.e., flipped) only when the second mirror current I9 or I10 generated by the current mirror circuit 112 based on the difference current I7 or I8 increases to IB3. Thus, as long as it is ensured in circuit design and layout design of the squelch detector that the mirror ratios p, q, r and s of the current mirror circuit 11 are sufficiently accurate, whether the output node D is flipped will be determined only by the squelch threshold VSQ. Moreover, considering the first bias current source IB1, the second bias current source IB2 and the third bias current source IB3 are all generated based on the reference bias current IB, the properties of these bias current sources IB1-IB3 will have a reduced impact on the inversion of the output node D. Therefore, in Embodiment 1, the inversion of the output node D in the squelch detector depends only on the squelch threshold VSQ, and is made independent of practical variations of process, voltage and temperature (PVT) parameters. Therefore, despite possible variations of the PVT parameters, the squelch detector will always be capable of reliable amplitude detection of the input signals VIP, VIN. In other words, compared with the prior art, the practical squelch threshold (i.e., threshold voltage) of the squelch detector in Embodiment 1 for amplitude detection of the input signals varies only to an insignificant extent.

It would be appreciated that, in Embodiment 1, each of the squelch threshold setting circuit 110, the signal input circuit 111, the current mirror circuit 112 and the logic circuit 113 may be implemented by any suitable circuit design known in the art, as long as they can perform the intended functions. This embodiment is not particularly limited in this regard.

As an example, referring to FIG. 3a, in Embodiment 1, the circuitry of the squelch detector can operate in both high (VDDH) and low (VDDL) voltage domains. In FIG. 3a, the MOS transistors labeled with the suffix "_H" are intended for operation in the high voltage domain (i.e., high-voltage MOS transistors), and all the remaining MOS transistors are intended for operation in the low voltage domain (i.e., low-voltage MOS transistors). A maximum operating voltage of the high-voltage MOS transistors is higher than a maximum operating voltage of the low-voltage MOS transistors. For example, the maximum operating voltage of the low-voltage MOS transistors may be 5 V or lower, while the maximum operating voltage of the high-voltage MOS transistors may be 5 V or higher. The first input signal VIP and the second input signal VIN are a pair of input differential signals, and the first reference voltage VRP and the second reference voltage VRN are reference voltages for the squelch detector.

In this embodiment, the squelch threshold setting circuit 110 includes a first pair of input transistors PM0_H, PM1_H, and the signal input circuit 111 includes a second pair of input transistors PM2_H, PM3_H. The current mirror circuit 112 includes a first set of transistors NM0, NM1, a second set of transistors NM2, NM3, a third set of transistors NM4, NM5 and a fourth set of transistors NM6, NM7.

Sources of the first pair of input transistors PM0_H and PM1_H are both coupled to the first bias current source IB1, and the first bias current source IB1 is also coupled to a high-voltage-domain power supply voltage VDDH. A gate of PM0_H is coupled to the first reference voltage VRP, and a gate of PM1_H is coupled to the second reference voltage VRN. A drain of PM0_H is coupled to a drain and a gate of NM0 in the first set of transistors, thereby providing the first current I1 to NM0. A drain of PM1_H is coupled to a drain and a gate of NM1 in the first set of transistors, thereby providing the second current I2 to NM1. Sources of NM0 and NM1 in the first set of transistors are both grounded. VRN and VRP can control the second current I2 and the first current I1 so that the difference between them is equal to a difference current Δi. As such, assuming the first current I1 is i, then the second current I2 is (i+Δi)=k*IB1, where k is a parameter associated with the squelch threshold VSQ. In this way, the first pair of input transistors PM0_H and PM1_H can generate and output, based on the first bias current source IB1, the second current I2 associated with the squelch threshold VSQ=VRP−VRN.

Sources of the second pair of input transistors PM2_H and PM3_H are both coupled to the second bias current source IB2, and the second bias current source IB2 is also coupled to the high-voltage-domain power supply voltage VDDH. A gate of PM2_H is coupled to the first input signal VIP, and a gate of PM1_H is coupled to the second input signal VIN. A drain of PM2_H is coupled to a drain of NM2 in the second set of transistors, thereby providing the third current I3 to NM3. A drain of PM2_H is coupled to a drain of NM3 in the second set of transistors, thereby providing the fourth current I4 to NM3. Sources of NM2 and NM3 in the second set of transistors are both grounded. A gate of NM2 is coupled to the gate of NM1 and a gate of NM3. NM1 and NM2 make up a current mirror, and NM2 is configured to generate the fifth current I5 as a mirror current of the second current I2, and NM3 is configured to generate the sixth current I6 as a mirror current of the second current I2. In this way, the difference current I7 between the third current I3 and the fifth current I5 (i.e., I7=I3−I5) can be generated at a node (not labeled) between the drain of PM2_H and the drain of NM2, and the difference current I8 between the fourth current I4 and the sixth current I6 (i.e., I8=I4−I6) can be generated at a node (not labeled) between a drain of PM3_H and the drain of NM3.

A gate of NM4 in the third set of transistors is coupled to a node of a drain of NM4, the drain of NM2 and the drain of PM2_H, and to a gate of NM7 in the fourth set of transistors. A gate of NM5 in the third set of transistors is coupled to a node of a drain of NM5, the drain of NM3 and the drain of PM3_H, and to a gate of NM6 in the fourth set of transistors. Sources of NM4 through NM7 are all grounded, and drains of NM6 and NM7 are both coupled to the third bias current source IB3 and the output node D. The third bias current source IB3 is also coupled to a low-voltage-domain power supply voltage VDDL. As such, NM4 and NM7 make up a current mirror, and NM5 and NM6 make up another current mirror. The difference current I7 flows through NM4 and is referred to hereinafter as a "seventh current I7", and the difference current I8 flows through NM5 and is referred to hereinafter as an "eight current I7". Moreover, I3=I5+I7, and I4=I6+I8.

It would be appreciated that, in Embodiment 1, the MOS transistors PM0_H-PM3_H and NM0-NM5 may together define a current difference threshold ∠I, for example, as (r/p)*I2, where r and p are mirror ratios of NM4 and NM5 to NM1. The difference current I7 or I8 is compared with the current difference threshold (i.e., NM6/NM7 with IB3) at the output node D, and level inversion of the output node D is controlled based on a result of the comparison. Specifically, when the difference current I7 is greater or smaller than the current difference threshold ∠I, NM7 generates the second mirror current I10 (second component of the second mirror current). When the difference current I8 is greater or smaller than the current difference threshold ∠I, the NM6 generates the second mirror current I9 (i.e., the first component of the second mirror current). In other words, when one of the difference currents I7 or I8 is greater or smaller than the current difference threshold ∠I, the second mirror current provided by the fourth set of transistors includes I9 and I10. When I9 or I10 is greater than the third bias current source IB3, the output node D is flipped to a first potential. When I9 and I10 are both smaller than the third bias current source IB3, the output node D is flipped to a second potential.

The logic circuit 113 includes two inverter stages INV1, INV2. That is, the inverters INV1, INV2 are cascaded. An input terminal of the inverter INV1 is coupled to the output node D, and an output terminal of the inverter INV2 is coupled to the filter circuit 13. The signal VO1 is output from the inverter INV2.

In Embodiment 1, the eight MOS transistors PM0_H-PM3_H and NM0-NM3 constitute a four-input voltage comparator. A transistor size ratio of PM0_H/PM1_H to PM2_H/PM3_H is p:(q+r), and a transistor size ratio of the three sets of transistors NM0/NM1, NM2/NM3 and NM4/NM5 is p:q:r. The transistor size of NM6/NM7 is s times the transistor size of NM4/NM5. The drains of NM6 and NM7 are both connected to the output node D. In this case, a transistor size ratio of the four sets of transistors NM0/NM1, NM2/NM3, NM4/NM5 and NM6/NM7 is p:q:r:(r*s).

In Embodiment 1, PM0_H-PM3_H are high-voltage PMOS transistors, and NM0-NM7 are all low-voltage NMOS transistors.

The level shifter circuit 10 may boost the four voltages VIP, VIN, VRP, VRN and feed them to the high-voltage-domain PMOS transistors, making the squelch detector of this embodiment suitable for use with the USB protocol (however, the present invention is not limited thereto). The USB protocol has two signal modes respectively for low-/full-speed data transmission and high-speed data transmission. The VIP and VIN signals may each comprise a voltage in the range of, for example, 0 V to 3.6 V for low-/full-speed data transmission and, for example, 0 V to 800 mV for high-speed data transmission. When the squelch detector detects a need for high-speed data transmission, VRN and VRP may be set to 0 V and 125 mV, respectively. Since the voltages of the input signals VIP and VIN may range from 0 V to 3.6 V, the high-voltage-domain PMOS transistors rather than the low-voltage-domain ones in the four-input voltage comparator may be utilized. The level shifter circuit 10 may, for example, utilize a source follower comprising the high-voltage PMOS transistors (not shown) to raise VIP, VIN, VRP, VRN by a gate-source voltage $V_{GS}$ of the high-voltage PMOS transistors. As a result, a source voltage of PM0_H is raised by 2 times $V_{GS}$ with respect to VRP/VRN, and a source voltage of PM2_H is raised by 2 times $V_{GS}$ with respect to VIP/VIN. Moreover, a drain-source voltage $V_{DS,PM0\_H}$ of PM0_H satisfies $V_{DS,PM0\_H}=|VRP/VRN|+2V_{GS}-V_{GS,NM0}$, where $V_{GS,NM0}$ represents a gate-source voltage of NM0. Similar relationships exist for drain-source voltages $V_{DS}$ of PM1_H-PM3_H. The four devices NM0-NM3 make up a current mirror, and in order for good mirroring performance of this current mirror to be achieved, the devices are desired to each have a high gate-source voltage $V_{GS}$. Accordingly, the level shifter circuit 10 of FIG. 3a may allow $V_{DS}$ of the four pairs of differential input transistors PM0_H-PM3_H to vary within a relatively large range. Operation in the saturation region can result in higher accuracy of the squelch threshold VSQ. Otherwise, without the level shifter circuit 10, PM0_H-PM1_H may operate around the edge of the linear region, leading to easy entry of PM2_H-PM3_H into the linear region during operation. This may result in an inaccurate squelch threshold VSQ. Further, since the output signal VO of the squelch detector is to be fed to a succeeding digital domain, both the third bias current source IB3 and the downstream logic circuit operate in the VDDL voltage domain.

How the squelch detector of Embodiment 1 operates will be described below.

At first, VRP and VRN set a theoretical threshold voltage of the squelch detector, i.e., the squelch threshold VSQ, as VSQ=VRP−VRN. VIP and VIN are input to the squelch detector for amplitude detection.

Currents flowing through PM0_H and PM1_H are equal to I1 and I2, respectively, and currents flowing through NM0 and NM1 are also equal to I1 and I2, respectively. Since NM2, NM3, NM1 have equal gate-source voltages, they constitute a current mirror. Therefore, a maximum current I5$_{max}$ flowing through NM2 and NM3 satisfies I5$_{max}$=I6$_{max}$=(q/p)*I2. Currents flowing through PM2_H and PM3_H are equal to I3 and I4, respectively. Currents flowing through NM2 and NM3 are equal to I5 and I6, respectively. Currents flowing through NM4 and NM5 are equal to I7 and I8, respectively. Moreover, I3=I5+I7, and I4=I6+I8. Currents flowing through NM6 and NM7 are equal to I9 and I10, respectively. A current ratio of IB1 to IB2 (i.e., the second predetermined ratio) is set as IB1:IB2=p:(q+r), and the IB3 current value is set as IB3=(s*r/p)*I2.

If the amplitude difference between the VIP and VIN signals is greater than VSQ, i.e., VIP−VIN>VSQ, since I4>[(q+r)/p]*I2, I6=(q/p)*I2, and I3<[(q+r)/p]*I1<[(q+r)/p]*I2, I7<(r/p)*I2. Moreover, the current I8 flowing through NM5 satisfies I8=I4-I6>(r/p)*I2, and the first component of the second mirror current I9 flowing through NM6 satisfies I9=s*I8>(s*r/p)*I2=IB3. As a result, the output node D is pulled down (i.e., flipped) by NM6, and both VO1 and VO are at a low level (e.g., "0"). Likewise, if VIN−VIP>VSQ, since I3>[(q+r)/p]*I2, I5=(q/p)*I2, and I4<[(q+r)/p]*I1<[(q+r)/p]*I2, I8<(r/p)*I2. The second component of second mirror current I10 flowing through NM7 satisfies I10=s*I7>(s*r/p)*I2=IB3. As a result, the output node D is pulled down (i.e., flipped), and both VO1 and VO are at a low level.

If the amplitude difference between the VIP and VIN signals is smaller than VSQ, i.e., |VIP−VIN|<VSQ, both the current I3 flowing through PM2_H and the current I4 flowing through PM3_H are smaller than [(q+r)/p]*I2, and the current flowing I7 through NM4 and the current I8 flowing through NM5 are smaller than (r/p)*I2. Thus, the second mirror current I9 flowing through NM6 and the second mirror current I10 flowing through NM7 are both smaller than IB3. As a result, the output node D is not pulled down (i.e., it is not flipped), and VO1 and VO are both at a high level.

Let I2=k*IB1, where k is a parameter associated with VSQ, then IB3=(s*r/p)*I2=(k*s*r/p)*IB1 is obtained. That is, a current ratio of IB3 to IB1 (i.e., the first predetermined ratio) is equal to k*s*r/p. In this case, the output node D will be pulled down (i.e., flipped), only when I9 and I10 increase to (k*s*r/p)*IB1. Whether the output node D is flipped is directly related to the magnitudes of the currents IB3, I9 and I10.

Reference is now made to FIG. 4, a signal timing diagram of the circuit of FIG. 3a.

As can be seen, as long as the maximum possible accuracy of the mirror ratios p, q, r and s of the current mirror circuit 112 are ensured during circuit design and layout design of the squelch detector, the invention of the output node D will be dependent on only the squelch threshold VSQ=VRP−VRN. Considering IB1, IB2 and IB3 are all generated based on IB, the properties of these three bias current sources IB1, IB2 and IB3 have a reduced impact on the inversion of the output node D.

Therefore, the threshold voltage of the squelch detector in Embodiment 1 is totally dependent on the squelch threshold VSQ, without being affected by variations of PVT parameters such as process corner, temperature and voltage. This facilitates the implementation of an intended protocol in a chip and dispenses with the need for calibration. Moreover, as the amplitude comparator circuit 11 in the squelch detector of Embodiment 1 is made up essentially of transistors and simple logic circuits, it offers the advantages of a simple structure and low cost.

It is noted that, in other examples of Embodiment 1, the circuit of FIG. 3a may be modified to operate only in the high voltage domain (VDDH), or only in the low voltage domain (VDDL), depending on the amplitudes of the signals VRP, VRN, VIP and VIN. For example, in another particular example of Embodiment 1, with reference to FIG. 3a, the high-voltage-domain power supply voltage VDDH that the first bias current source IB1 and the second bias current source IB2 are coupled to may be replaced with a lowvoltage-domain power supply voltage VDDL, and the high-voltage PMOS transistors PM0_H-PM3_H may be accordingly replaced with low-voltage transistors (e.g., PM0-PM3 in FIG. 5).

It is also noted that, in other examples of Embodiment 1, the level shifter circuit 10 and/or the filter circuit 13 may be omitted according to practical needs.

Embodiment 2

Figure 5:
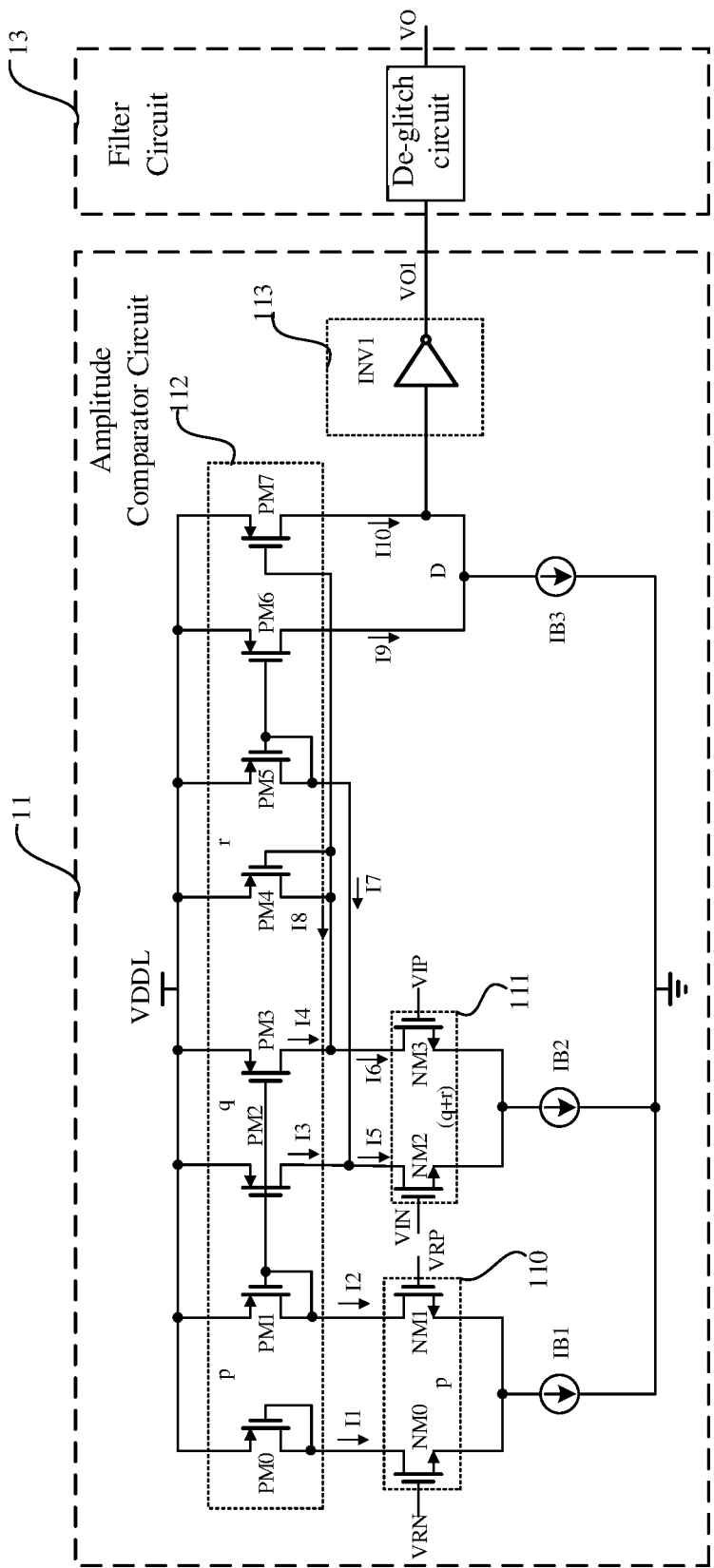
FIG. 5 is a schematic diagram showing a particular, exemplary circuit implementation of a squelch detector according to a second embodiment of the present invention.

Referring to FIG. 5, in Embodiment 2 of the present invention, there is provided a squelch detector also including an amplitude comparator circuit 11, and the amplitude comparator circuit 11 also includes a squelch threshold setting circuit 110, a signal input circuit 111, a current mirror circuit 112 and a logic circuit 113. The amplitude comparator circuit 11 of Embodiment 2 differs from that in the squelch detector of FIG. 3a in that: (1) a first bias current source IB1 is implemented as a tail current of the squelch threshold setting circuit 110, a second bias current source IB2 as a tail current of the signal input circuit 111 and a third bias current source IB3 as a tail current of the current mirror circuit 112; (2) the amplitude comparator circuit 11 operates in a low voltage domain, i.e., the squelch threshold setting circuit 110, the signal input circuit 111 and the current mirror circuit 112 are all connected to a low-voltage-domain power supply voltage VDDL, with a first pair of input transistors in the squelch threshold setting circuit 110 consisting of low-voltage NMOS transistor NM0, NM1, a second pair of input transistors in the signal input circuit 111 consisting of low-voltage NMOS transistor NM2, NM3 and the current mirror circuit 112 consisting of low-voltage PMOS transistors PM0-PM7; and (3) the logic circuit 113 consists of a single inverter INV1.

Specifically, in Embodiment 2, sources of PM0-PM7 are all coupled to the low-voltage-domain power supply voltage VDDL. A gate and drain of PM0 are coupled to a drain of NM0. A gate and drain of PM1 are coupled to a drain of NM1, gates of PM2, PM3, and a gate of NM0 is coupled to the second reference voltage VRN, and a gate of NM1 is coupled to the first reference voltage VRP. Sources of NM0 and NM1 are both coupled to one end of the first bias current source IB1, and the other end of the first bias current source IB1 is grounded. A drain of PM2 is coupled to a drain of NM2, a drain and a gate of PM5 and a gate of PM6. A drain of PM3 is coupled to a drain of NM3, a drain and a gate of PM4 and a gate of PM7. Sources of NM2 and NM3 are both coupled to one end of the second bias current source IB2, and the other end of the second bias current source IB1 is grounded. A drain of PM6, a drain of PM7, one end of the third bias current source IB3 and an input terminal of the inverter INV1 are all coupled to an output node D, and the other end of the third bias current source IB3 is grounded. An output terminal of the inverter INV1 is coupled to the filter circuit 13, and the inverter INV1 outputs VO1 at its output terminal.

In Embodiment 2, a transistor size ratio of NM0/NM1 to NM2/NM3 is p:(q+r), and a transistor size ratio of the three sets of transistors PM0/PM1, PM2/PM3, PM4/PM5 is p:q:r. A transistor size of PM6/PM7 is s times the transistor size of PM4/PM5. Moreover, IB1:IB2=p:(q+r), and IB3:IB1=k*s*r/p.

The squelch detector of Embodiment 2 operates in a similar way to that of Embodiment 1 and, therefore, needs not be described in further detail herein. If |VIP−VIN|>VSQ, there will be a second mirror current I9>IB3, or a second mirror current I10>IB3. As a result, the node D is pulled up by PM6 or PM7, and VO1 and VO are both at a low level. If |VIP−VIN|<VSQ, I9<IB3 and I10<IB3. As a result, the node D is pulled down by IB3, and VO1 and VO are both at a high level. Therefore, whether the output node D in the squelch detector of Embodiment 2 is flipped is also determined only by the squelch threshold VSQ=VRP−VRN and is independent of any practical variation of the squelch threshold that may result from variations of process, voltage and temperature (PVT) parameters. Thus, the squelch detector can always provide reliable amplitude detection of input signals in spite of possible variations of the PVT parameters.

It would be appreciated that, in other examples of Embodiment 2, a level shifter circuit 10 and/or a filter circuit 13 may be selectively added or omitted, as needed.

Embodiment 3

Figure 6:
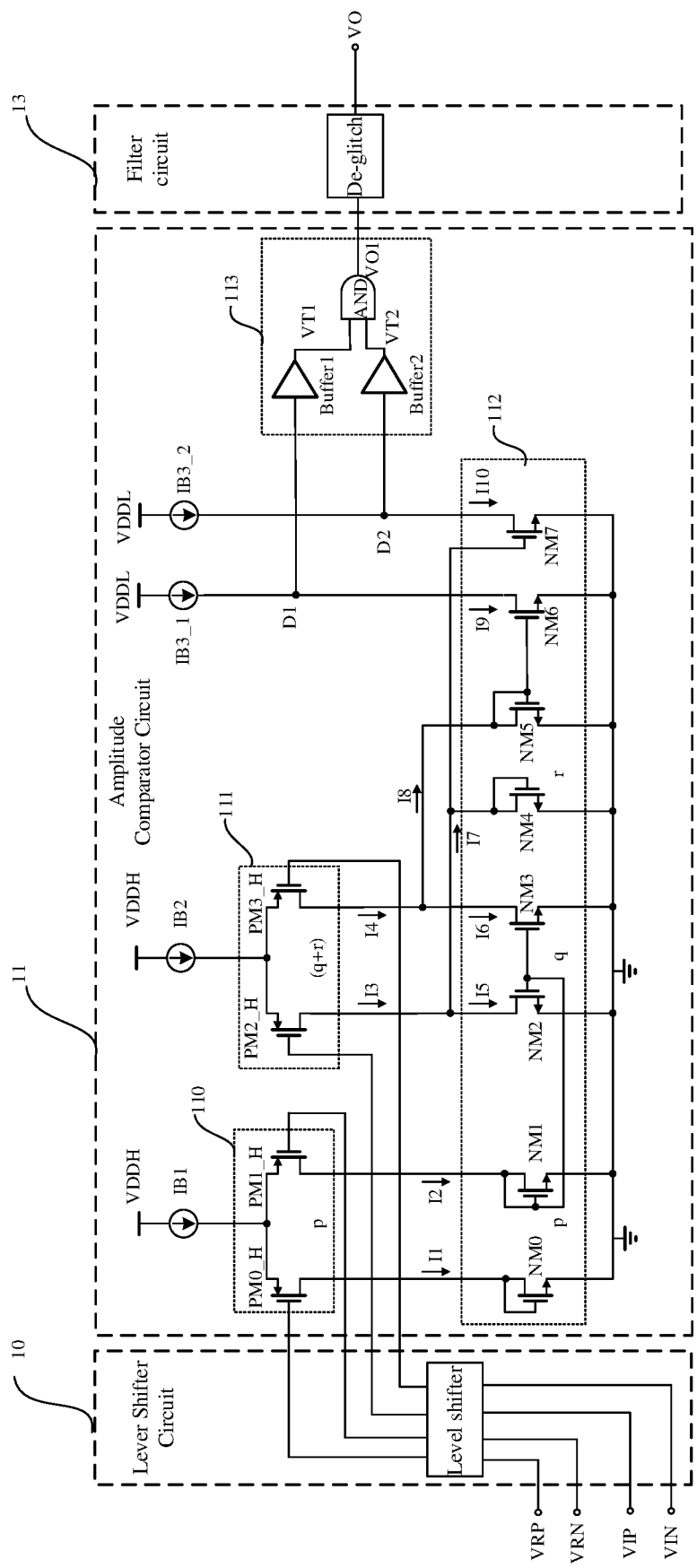
FIG. 6 is a schematic diagram showing a particular, exemplary circuit implementation of a squelch detector according to a third embodiment of the present invention.

Referring to FIG. 6, in Embodiment 3 of the present invention, there is provided a squelch detector also including an amplitude comparator circuit 11, and the amplitude comparator circuit 11 also includes a squelch threshold setting circuit 110, a signal input circuit 111, a current mirror circuit 112 and a logic circuit 113. The amplitude comparator circuit 11 of Embodiment 3 is substantially similar in structure to that in the squelch detector of FIG. 3a, except that: (1) it has two output nodes D1 and D2, the output node D1 coupled to a first sub-bias current source of the third bias current sources IB3_1 and a second mirror current I9, the output node D2 coupled to a second sub-bias current source of the third bias current source IB3_2 and a second mirror current I10; and (2) the logic circuit 113 includes a first buffer Buffer1, a second buffer Buffer2 and an AND gate AND.

Specifically, the output node D1 is coupled to the first sub-bias current source of the third bias current sources IB3_1, a drain of NM6 and an input terminal of the first buffer Buffer1, and the output node D2 is coupled to the second sub-bias current source of the third bias current source IB3_2, a drain of NM7 and an input terminal of the second buffer Buffer2. An output terminal of the first buffer Buffer1 is coupled to one input terminal of the AND gate AND, and an output terminal of the second buffer Buffer2 is coupled to another input terminal of the AND gate AND. An output terminal of the AND gate AND is coupled to an input terminal of the filter circuit 13.

In the squelch detector of Embodiment 3, currents flowing through IB3_1 and IB3_2 are equal to each other and to IB3 in Embodiment 1. That is, IB3_1=IB3_2=IB3.

Figure 7:
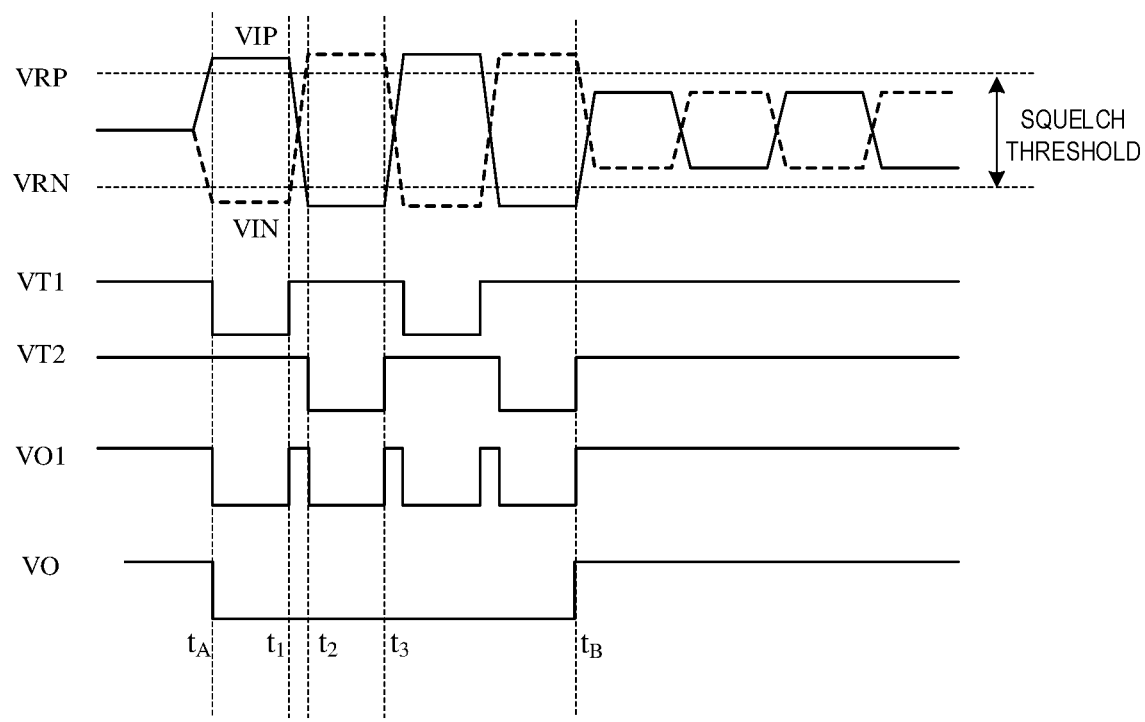
FIG. 7 is a signal timing diagram of the squelch detector of FIG. 6.

Referring to FIGS. 6 and 7, during operation of the squelch detector in Embodiment 3, if |VIP−VIN|>VSQ=VRP−VRN, the second mirror current I9 is >IB3_1, and the output node D1 is pulled down by NM6; or the second mirror current I10 is >IB3_2, and the node D2 is pulled down by NM7. In the latter case, VT1 output from the first buffer Buffer1 or VT2 from the second buffer Buffer2 is at a low level. As a result, VO1 output from the AND gate AND and VO from the filter circuit 13 are both at a low level. On the contrary, if |VIP−VIN|<VSQ, I9<IB3 and I10<IB3. As a result, the output nodes D1 and D2 are both pulled up, leading to a high level of VT1 and VT2 and hence of VO1 and VO.

Apparently, whether the output nodes D in the squelch detector of Embodiment 3 are flipped is also determined only by the squelch threshold VSQ=VRP−VRN and is independent of any practical variation of the squelch threshold that may result from variations of process, voltage and temperature (PVT) parameters. Thus, the squelch detector can always provide reliable amplitude detection of input signals in spite of possible variations of the PVT parameters. This facilitates the implementation of an intended protocol in a chip and dispenses with the need for calibration.

It is noted that, in other examples of Embodiment 3, the circuit of FIG. 6 may be modified to operate only in the high voltage domain (VDDH), or only in the low voltage domain (VDDL), depending on the amplitudes of the signals VRP, VRN, VIP and VIN. For example, in another particular example of Embodiment 3, with reference to FIG. 6, the high-voltage-domain power supply voltage VDDH that the first and second bias current sources IB1 and IB2 are coupled to may be replaced with a low-voltage-domain power supply voltage VDDL, and the high-voltage PMOS transistors PM0_H-PM3_H may be accordingly replaced with low-voltage transistors (e.g., PM0-PM3 in FIG. 5).

It is also noted that, in other examples of Embodiment 3, the level shifter circuit 10 and/or the filter circuit 13 may be omitted as needed.

Embodiment 4

Figure 8:
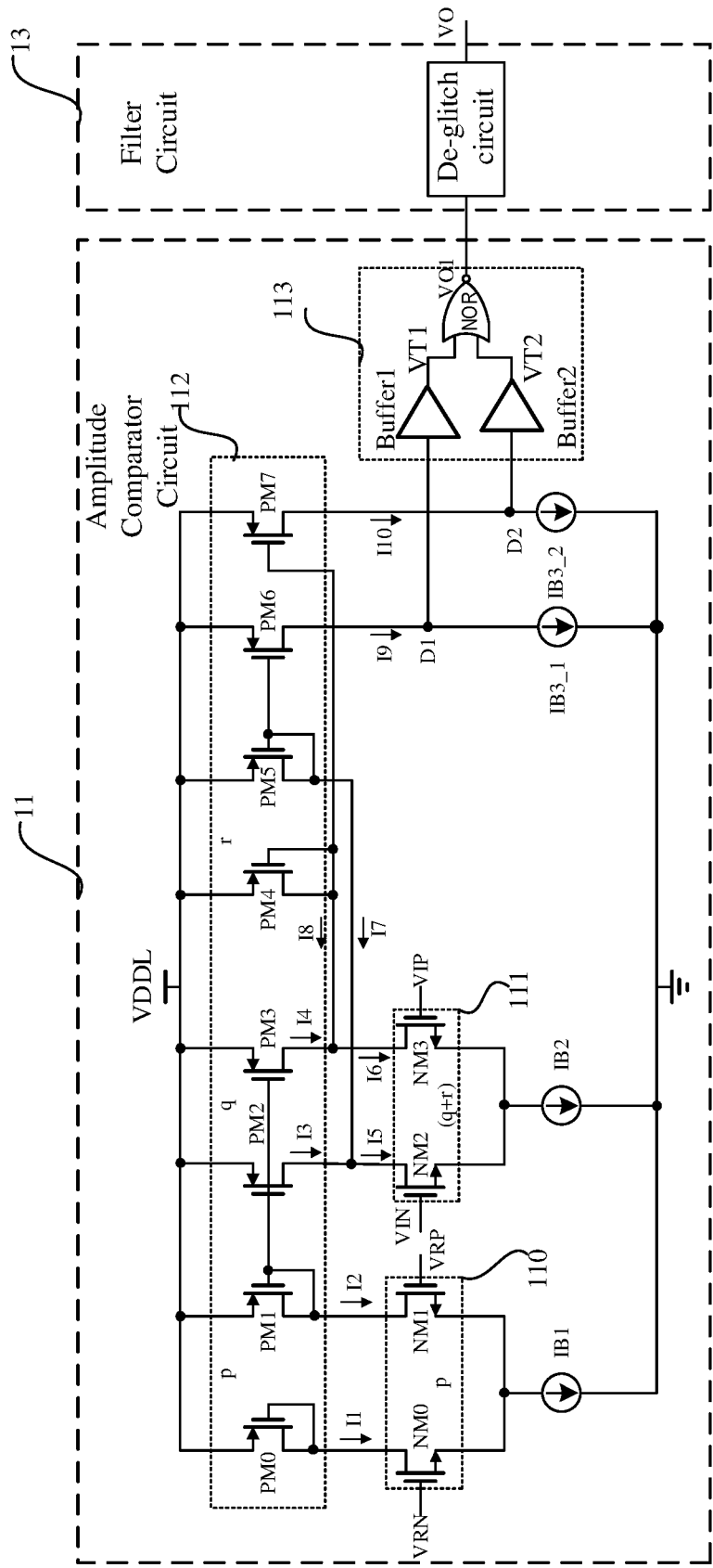
FIG. 8 is a schematic diagram showing a particular, exemplary circuit implementation of a squelch detector according to a fourth embodiment of the present invention.

Referring to FIG. 8, in Embodiment 4 of the present invention, there is provided a squelch detector also including an amplitude comparator circuit 11, and the amplitude comparator circuit 11 also includes a squelch threshold setting circuit 110, a signal input circuit 111, a current mirror circuit 112 and a logic circuit 113. The amplitude comparator circuit 11 of Embodiment 4 is substantially similar in structure to that in the squelch detector of Embodiment 2 shown in FIG. 5, except that: (1) it has two output nodes D1 and D2, the output node D1 coupled to a first sub-bias current source of the third bias current sources IB3_1 and a second mirror current I9, the output node D2 coupled to a second sub-bias current source of the third bias current source IB3_2 and a second mirror current I10; (2) the logic circuit 113 includes a first buffer Buffer1, a second buffer Buffer2 and a NOR gate NOR.

Specifically, the output node D1 is coupled to the first sub-bias current source of the third bias current sources IB3_1, a drain of PM6 and an input terminal of the first buffer Buffer1, and the output node D2 is coupled to the second sub-bias current source of the third bias current source IB3_2, a drain of PM7 and an input terminal of the second buffer Buffer2. An output terminal of the first buffer Buffer1 is coupled to one input terminal of the NOR gate NOR, and an output terminal of the second buffer Buffer2 is coupled to another input terminal of the NOR gate NOR. An output terminal of the NOR gate NOR is coupled to an input terminal of the filter circuit 13.

In the squelch detector of Embodiment 4, currents flowing through IB3_1 and IB3_2 are equal to each other and to IB3 in Embodiment 1. That is, IB3_1=IB3_2=IB3.

Figure 9:
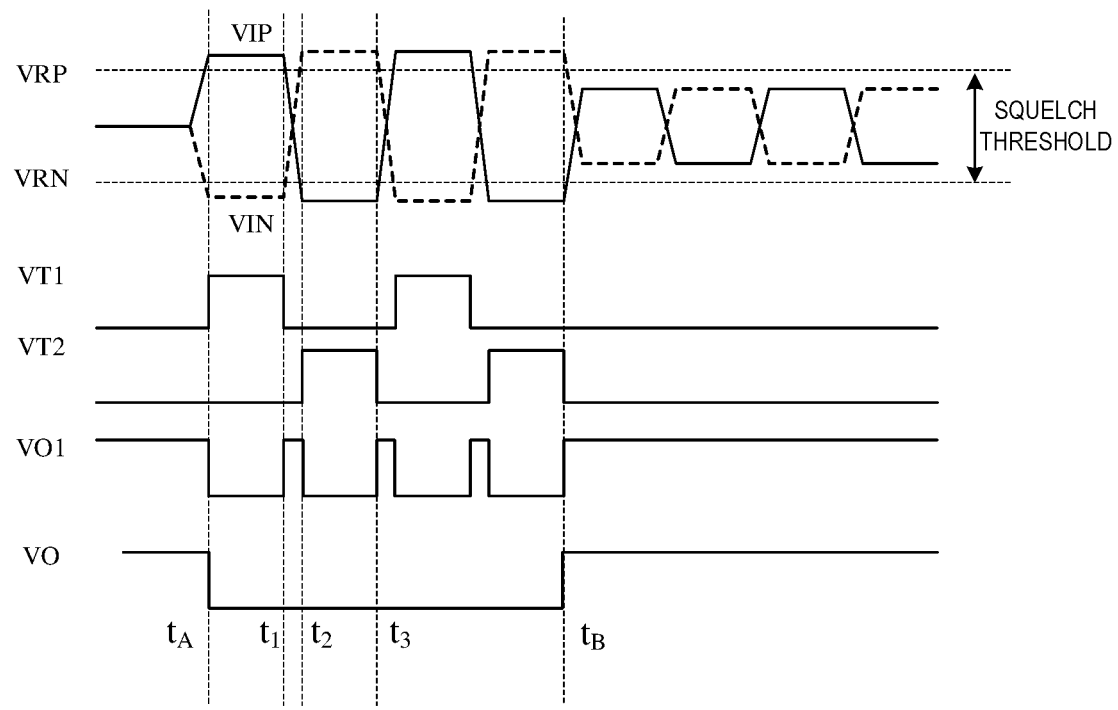
FIG. 9 is a signal timing diagram of the squelch detector of FIG. 8.

Referring to FIGS. 8 and 9, if |VIP−VIN|>VSQ, the second mirror current I9 is >IB3_1, and the output node D1 is pulled up by PM6; or the second mirror current I10 is >IB3_2, and the output node D2 is pulled up by PM7. VT1 output from the first buffer Buffer1 or VT2 from the second buffer Buffer2 is at a higher level. As a result, VO1 output from the NOR gate NOR and VO from the filter circuit 13 are both at a low level. On the contrary, if |VIP−VIN|<VSQ, I9<IB3_1 and I10<IB3_2. As a result, the output nodes D1 and D2 are both pulled down, leading to a low level of VT1 and VT2, and the VO1 and VO are at a high level.

Apparently, whether the output nodes D in the squelch detector of Embodiment 4 are flipped is also determined only by the squelch threshold VSQ=VRP−VRN and is independent of any practical variation of the squelch threshold that may result from variations of process, voltage and temperature (PVT) parameters. Thus, the squelch detector can always provide reliable amplitude detection of input signals in spite of possible variations of the PVT parameters. This facilitates the implementation of a protocol in a chip and dispenses with the need for calibration.

The foregoing description presents merely preferred embodiments of the present invention and is not intended to limit the scope of the present invention in any way. Any and all changes and modifications made by those of ordinary skill in the art in light of the above teachings without departing from the spirit of the present invention are intended to be within the scope as defined by the appended claims.

What is claimed is:

1. A squelch detector comprising an amplitude comparator circuit, wherein the amplitude comparator circuit comprises:
   a squelch threshold setting circuit coupled to each of a first bias current source, a first reference voltage and a second reference voltage, wherein the squelch threshold setting circuit is configured to set a squelch threshold of the squelch detector to be equal to a difference between the first reference voltage and the second reference voltage, and to generate a current associated with the first bias current source and the squelch threshold;
   a signal input circuit coupled to each of a second bias current source, a first input signal and a second input signal, wherein the signal input circuit is configured to generate, based on the second bias current source, a current associated with an amplitude difference between the first input signal and the second input signal; and
   a current mirror circuit coupled to each of a third bias current source, the squelch threshold setting circuit and the signal input circuit, wherein the current mirror circuit is configured to: generate a first mirror current of the current output from the squelch threshold setting circuit, generate a difference current between the current output from the signal input circuit and the first mirror current, and generate a second mirror current of the difference current; and provide the third bias current source and the second mirror current to a corresponding output node in the squelch detector to control a flip of the output node,
   wherein when the second mirror current is greater or smaller than the third bias current source, the output node is flipped.

2. The squelch detector of claim 1, wherein a current ratio of the third bias current source to the first bias current source is a first predetermined ratio, and wherein the first predetermined ratio is configured in association with a mirror ratio of the current mirror circuit and the squelch threshold;
   wherein a current ratio of the first bias current source to the second bias current source is a second predetermined ratio, and wherein the second predetermined ratio is a constant associated only with the mirror ratio of the current mirror circuit.

3. The squelch detector of claim 2, wherein the second predetermined ratio is p/(q+r), and the first predetermined ratio is k*s*r/p, where k is a parameter associated with the squelch threshold, and p, q, r and s are constants associated with the mirror ratio of the current mirror circuit.

4. The squelch detector of claim 3, wherein the current output from the squelch threshold setting circuit is I2 and satisfies I2=k*IB1, where IB1 is a current of the first bias current source.

5. The squelch detector of claim 4, wherein when the difference current is greater or smaller than a current difference threshold, the output node is flipped, wherein a ratio of the current difference threshold to the first bias current source is k*r/p.

6. The squelch detector of claim 3, wherein the squelch threshold setting circuit comprises a first pair of input transistors, the signal input circuit comprising a second pair of input transistors, and wherein a transistor size ratio of the first pair of input transistors to the second pair of input transistors is p:(q+r).

7. The squelch detector of claim 6, wherein the current mirror circuit comprises:
- a first set of transistors, coupled to the squelch threshold setting circuit and configured to receive the current output from the squelch threshold setting circuit;
- a second set of transistors coupled to the signal input circuit and the first set of transistors, wherein the second set of transistors is configured to generate the first mirror current by mirroring the current output from the squelch threshold setting circuit, and to generate the difference current between the current output from the signal input circuit and the first mirror current;
- a third set of transistors, coupled to the second set of transistors and configured to receive the difference current; and
- a fourth set of transistors coupled to each of the third bias current source, the third set of transistors and a corresponding output node, wherein the fourth set of transistors is configured to generate the second mirror current by mirroring the difference current,
wherein a transistor size ratio of the first set of transistors, the second set of transistors, the third set of transistors and the fourth set of transistors is p:q:r:(r*s).

8. The squelch detector of claim 7, wherein each of the first pair of input transistors and the second pair of input transistors is a pair of PMOS transistors, wherein each of the first set of transistors, the second set of transistors, the third set of transistors and the fourth set of transistors is a set of NMOS transistors, wherein the first bias current source is coupled between a first power supply voltage and sources of the first pair of input transistors, wherein the second bias current source is coupled between the first power supply voltage and sources of the second pair of input transistors, and wherein the third bias current source is coupled between a second power supply voltage and drains of the fourth set of transistors.

9. The squelch detector of claim 7, wherein each of the first pair of input transistors and the second pair of input transistors is a pair of NMOS transistors, wherein each of the first set of transistors, the second set of transistors, the third set of transistors and the fourth set of transistors is a set of PMOS transistors, wherein the first bias current source is coupled between the sources of the first pair of input transistors and a ground, wherein the second bias current source is coupled between the sources of the second pair of input transistors and the ground, and wherein the third bias current source is coupled between the drains of the fourth set of transistors and the ground.

10. The squelch detector of claim 1, wherein the squelch threshold setting circuit operates in a same voltage domain as the signal input circuit.

11. The squelch detector of claim 1, wherein: the current mirror circuit operates in the same voltage domain as the signal input circuit; or the current mirror circuit operates in a voltage domain lower than a voltage domain of the signal input circuit.

12. The squelch detector of claim 1, further comprising a bias current source generator circuit, wherein the bias current source generator circuit is coupled to each of a reference bias current, the squelch threshold setting circuit, the signal input circuit and the current mirror circuit, and is configured to generate the first bias current source, the second bias current source and the third bias current source based on the reference bias current.

13. The squelch detector of claim 1, further comprising a level shifter circuit, wherein the level shifter circuit is coupled to each of the first reference voltage, the second reference voltage, the first input signal, the second input signal, the squelch threshold setting circuit and the signal input circuit, and wherein the level shifter circuit is configured to provide converted first and second reference voltages with suitable levels to the squelch threshold setting circuit, and to provide converted first input signal and second input signal with suitable levels to the signal input circuit.

14. The squelch detector of claim 1, further comprising a logic circuit coupled to the output node, wherein the logic circuit is configured to output a logical signal depending on whether the output node is flipped, thereby indicating whether the amplitude difference between the first input signal and the second input signal exceeds the squelch threshold.

15. The squelch detector of claim 14, comprising a single output node, wherein the logic circuit comprises a single inverter or at least two cascaded inverters coupled to the single output node.

16. The squelch detector of claim 14, comprising a single output node, wherein the squelch detector has a first output node and a second output node, wherein the third bias current source comprises a first sub-bias current source and a second sub-bias current source that have a same magnitude, wherein the logic circuit comprises a first inverter, a second inverter and a corresponding logic gate, wherein the first output node is coupled to each of the first sub-bias current source, the first mirror current output from the current mirror circuit and an input terminal of the first inverter, wherein the second output node is coupled to each of the second sub-bias current source, the second mirror current output from the current mirror circuit and an input terminal of the second inverter, wherein an output terminal of the first inverter and an output terminal of the second inverter are coupled to two input terminals of the logic gate, and wherein the logic gate outputs a corresponding logical signal.

17. The squelch detector of claim 14, further comprising a filter circuit, coupled to the logic circuit and configured to filter out glitches in the logical signal output from the logic circuit.

18. The squelch detector of claim 1, wherein the second mirror current comprises a first component and a second component, wherein when the first component or the second component of the second mirror current is greater than the third bias current source, the output node is flipped to a first potential, and wherein when each of the first component and the second component of the second mirror currents is smaller than the third bias current source, the output node is flipped to a second potential.

* * * * *